United States Patent [19]

Doland

[11] 4,038,636
[45] July 26, 1977

[54] MULTIPLE DECODING SYSTEM

[76] Inventor: George D. Doland, 1602 Redway Lane, Houston, Tex. 77062

[21] Appl. No.: 588,028

[22] Filed: June 18, 1975

[51] Int. Cl.² .................................. G06F 11/12
[52] U.S. Cl. ................ 340/146.1 AV; 340/146.1 AL; 340/146.1 AQ
[58] Field of Search ................ 340/146.1, 146.1 AQ, 340/146.1 AV, 146.1 AL

[56] References Cited

U.S. PATENT DOCUMENTS

| | | | |
|---|---|---|---|
| 2,956,124 | 10/1960 | Hagelbarger | 340/146.1 AQ |
| 3,227,999 | 1/1966 | Hagelbarger | 340/146.1 AQ |
| 3,447,132 | 5/1969 | Kohlenberg | 340/146.1 AQ |
| 3,457,562 | 7/1969 | Fano | 340/146.1 AV |
| 3,588,819 | 6/1971 | Tong | 340/146.1 AQ |
| 3,665,396 | 5/1972 | Forney, Jr. | 340/146.1 AV |
| 3,789,360 | 1/1974 | Clark, Jr. et al. | 340/146.1 AQ |
| 3,831,142 | 8/1974 | Fletcher et al. | 340/146.1 AQ |
| 3,842,400 | 10/1974 | Liefeld et al. | 340/146.1 AQ |
| 3,872,432 | 3/1975 | Bismarck | 340/146.1 AQ |

OTHER PUBLICATIONS

Peterson & Weldon, Error-Correcting Codes, The MIT Press, 1972, pp. 392–426.

Primary Examiner—Charles E. Atkinson

[57] ABSTRACT

This disclosure describes a Multiple Decoding System which includes a means for encoding digital data and decoding by three different methods. These methods are referred to as Parity Decoding which includes Parity I and Parity II Decoding, Sequential Decoding by rank, and a combination of these two methods. This third method is Multiple Decoding and consists of a combination of Parity and Sequential Decoding.

3 Claims, 1 Drawing Figure

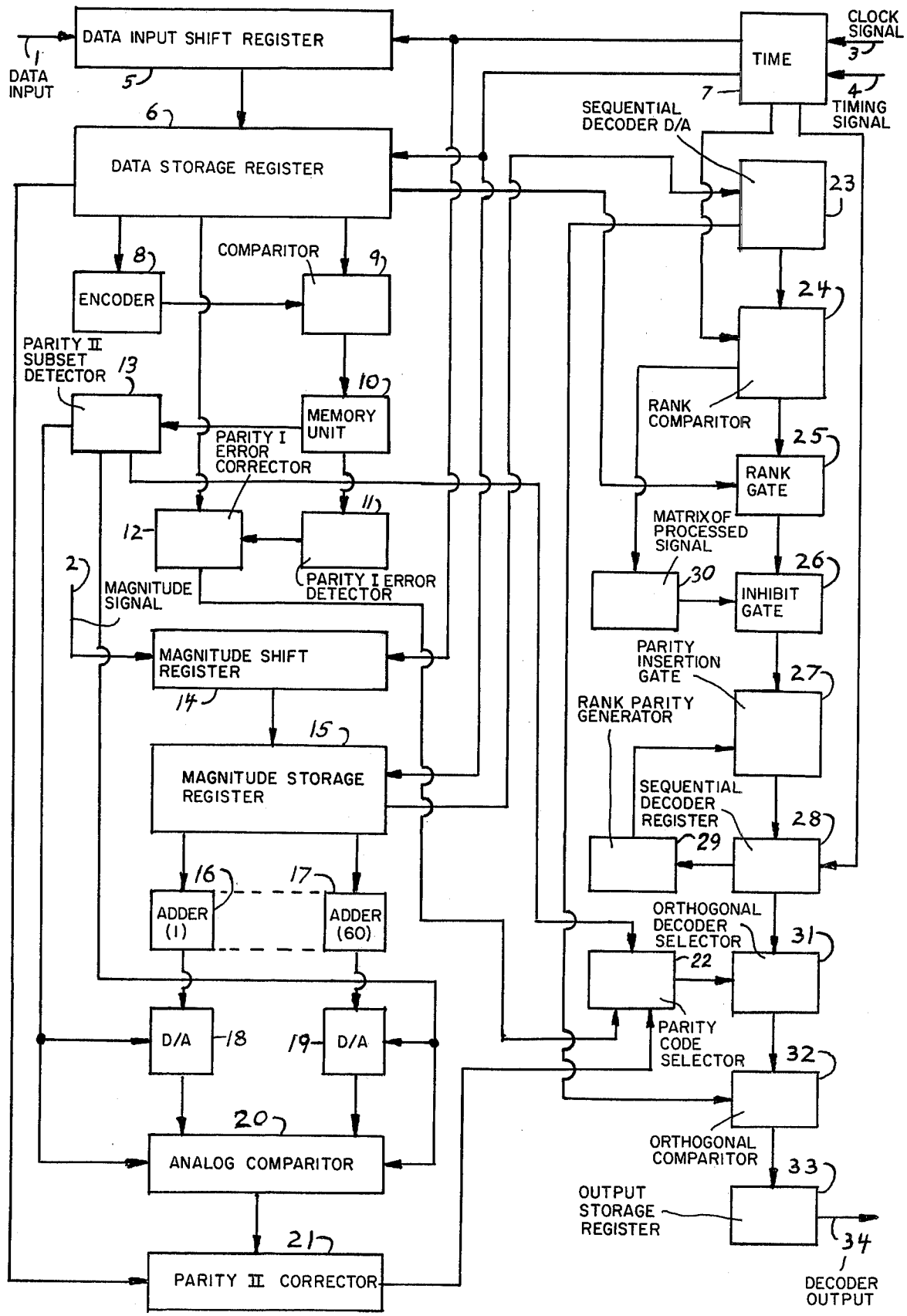

MULTIPLE DECODING SYSTEM

BACKGROUND OF THE INVENTION

Dr. C. E. Shannon proposed a theory that improved performance could be obtained from data transmission systems by encoding, transmitting the data, and decoding using an error correcting decoder. Work has proceeded on this theory for more than 25 years and a number of systems developed. The most recent is the convolutional encoder and Viterbi decoder. There are other techniques which may be used and this invention relates to a Multiple Decoding System which encodes and decodes either a digital bit stream in segments up to eleven data bits by adding five code bits; or encodes and decodes the data on a word by word basis. This coding and decoding system is not like either block codes or convolutional codes.

The Viterbi decoder with rate $\frac{1}{2}$ coding and using antipodal transmission has six states of ambiguity and has a coding loss of 4.8 db; the coding loss of the Multiple Decoding System is less than 1-$\frac{1}{2}$ db. Superior performance, while theoretically possible with the convolutional encoding and Viterbi decoding has not been demonstrated with respect to the Multiple Decoding System. The severe coding loss for convolutional encoding with a rate of $\frac{1}{3}$ code provides a definite problem not present with the Multiple Decoding System. The performance of each system is approximately equal. The low coding loss and no tendency to propogate errors provides a margin of superiority for the Multiple Decoding System. This disclosure explains the code, method of encoding, Parity I and Parity II decoding, Sequential decoding and then selecting a single output from the two methods for the final Multiple Decoder System output.

Parity decoding is a technique for decoding encoded signals which have been encoded using a unique method for generating a plurality of check bits. One received bit error per data word can be corrected from the received while two bit error per data word received can be correctly decoded for the majority of words using the code characteristics and probability theory based upon the received signal magnitude for each bit received. Sequential decoding is a completely different method of decoding. In this method, the bits received are ranked by magnitude and the bits of high rank are used first in decoding. The bits with the lowest rank are not used and these have the greatest probitility of error. Because they are not used, most words are correctly decoded. Multiple decoding uses a combination of both Parity and Sequential decoding.

BRIEF DESCRIPTION OF THE DRAWING

The FIGURE shows a decoder for implementing the Multiple Decoding System as described in the Detailed Description.

DETAILED DESCRIPTION

About 30 years ago, Dr. C. E. Shannon proposed a theory indicating superior performance in data transmission by encoding, transmitting the data, and then decoding the information with an error correcting decoder. One common system employs a convolutional encoder with a rate $\frac{1}{2}$ code and uses a Viterbi decoder for recovering the data. The problem with this decoder is the high coding loss of 4.8 db and six state ambiguity when using antipodal transmission. The multiple decoder has the advantage of simplicity and a coding loss of less than 1-$\frac{1}{2}$ db; so most of the improvement provided by the Multiple Decoding System results in an actual improvement in the performance of the system.

In the full code, 11 data bits are coded by adding five parity check bits which provides a total of 16 bits per coded data word. This is an ideal number because many computers use a hexidecimal number base using two bytes of eight bits and digital logic components are available called large scale integration making a small light weight unit practical to construct. The code rate is 11/16 and provides 1.38 db coding loss. This type of system has an application for world wide communication by using a synchronous orbit relay satellite at about 22,000 miles. The reduction in power required for transmission is very significant and applies to transmission both to and from the satellite for both directions in a two way link.

This code is called a 11-5 code because it consists of eleven data bits and five coding bits. The 11 data bits are transmitted with the five coding bits forming a 16 bit data word. For purposes of explanation, the data bits will be referred to as D1, D2, D3 and so forth to D11. The parity check bits will be referred to as P1, P2, P3, P4 and P5. Either even or odd parity can be used but for practical reasons, odd parity is preferred because the bit synchronizer (available from several manufacturers) requires bit transitions to operate. With odd parity, bit transitions are always available while with even parity, there will be no transitions with a long series of either digital ones or digital zeros in the digital bit stream. Although odd parity is more desirable from a practical point, explanation of the system is made simpler by using even parity. There is also no requirement that all parity bits have the same parity. The system may be implemented using odd parity for some of the parity bits and even parity for the remaining.

Table 1, is a coding table which shows a particular set of data bits which are used to determine each parity bit.

TABLE 1

| PARITY BITS | CODING TABLE DATA BITS | | | | | | | | | | |
|---|---|---|---|---|---|---|---|---|---|---|---|
| | D1 | D2 | D3 | D4 | D5 | D6 | D7 | D8 | D9 | D10 | D11 |
| P-1 | X | X | X | X | X | X | X | | | | |
| P-2 | X | X | X | X | | | | X | X | X | |
| P-3 | X | X | | | X | X | | X | X | | X |
| P-4 | X | | X | | X | | X | X | | X | X |
| P-5 | X | | | X | | X | X | | X | X | X |

Parity bit P1 is determined by data bits D1 through D7. Parity bit P2 is determined by data bits D1 through D4 and D8 through D10. A similar technique is used for parity bits P3 through P5. As an example, assume data bits are 1 0 0 1 1 1 0 1 1 0 1 for D1 through D11 respectively and even parity is used. The parity bits are as follows: P1 = 0, P2 = 0, P3 = 0, P4 = 0 and P5 = 1. This coding table has several distinct features. First, all parity bits are determined by seven data bits. Data bit, D1 is used in determining each parity bit. Each of the remaining data bits is used in determining three of the parity bits. The group of data bits, D2 through D11, are used so that every combination of five items taken three at a time are used. By interchanging rows, columns or both does not change the code and all provide identical performance. Consequently, the order of transmission of data and parity bits is of no consequence, as long as the encoder and decoder are compatible.

When it is desired to operate so each data word is encoded and decoded indeendently, and there are less than 11 data bits per word, one or more date data bits are set to zero and not transmitted. Three common length data words are 10, eight and seven bits. For example, if 10 data bits are used, D1 would be set to zero and D1 not transmitted. If there are eight data bits per word, any three data bits may be set to zero and not transmitted, these three may be selected arbitrarily.

A unique situation occurs when the data consists of seven bits. In this situation, P1 is the parity of the data word of the last four data bits, D8 through D11 are not used. Parity I and Parity II decoding requires five parity bits but not Sequential coding so a system can be implemented using a 7-4 code.

There are numerous variations which may be derived from the basic 11-5 code. A 6-4 or 6-5 code can be derived by simply setting data bit D1, and D8 through D11 to zero and using either parity bits P1 through P5 or P2 through P5. A 12 bit data word can be transmitted in two 6 bit bytes and each byte decoded prior to combining the bytes to one word. Consequently, this code can be used for data words which may consist of any number of data bits or in the other mode where 11 bit segments are coded, transmitted, decoded and then decommutated.

The encoding function is extremely simple and can be implemented by anyone experienced in the pulse code modulation systems. Ordinarily in a Pulse Code Modulation Unit often called a Commutator, the bits are loaded into a shift register in parallel and then shifted out serially. Having selected the coding pattern to be used, each parity bit is generated by a parity generator digital module or similar device for eight bit data. Parity generator logic modules are available from several manufacturers. Five of these items are required, one for each parity bit. These parity bits are parallel loaded into the shift register with the data. As stated previously, the sequence is not important in transmission so position in the shift register is not of particular significance. However, if the advantages of odd parity are to be gained, a typical sequence will consist of two data bits followed by a parity bit. This sequence would be used until all data bits and parity bits are used for the 16 bit sequence in an 11-5 code. One very significant feature of the encoder is the extreme simplicity. It is extremely important to have a light weight low power unit when the transmitter is in a satellite with limited power.

The principal feature of this invention involves recovery of the data by an error correcting decoder. If there were no errors, there would be no need for encoding and decoding. However, because of random noise, the data received has errors and the data received is not exactly like that transmitted. To prevent confusion between the transmitted data which is also considered the correct information; the received data bits will be referred to as bits B1 through B11 and the parity bits as check bits C1 through C5 for parity decoding.

In Parity I decoding, one error is assumed and the entire decoding process is based upon the code characteristics. The received data bits are stored in a shift register (also a commonly available digital logic device). Bits B1 through B11 are again encoded using the parity generator to produce a new set of five parity or check bits. Since B1 through B11 may not be identical with data bits transmitted D1 through D11 or the parity bits P1 through P5 may not agree with the check bits received C1 through C5 because of errors in transmission; the 16 transmitted bits may not correspond to the received bits. Again to prevent confusion between similar or corresponding bits but which may actually differ, the bits generated by encoding the received data bits are referred to as recoded bits R1 through R5 which correspond to P1 through P5 and C1 through C5.

For Parity I decoding, the recoded bits are compared with the corresponding check bits C1 through C5. If all agree, the word is assumed to be received with no error although there is a small probability one of several combinations of four bit errors were received. However, this type error cannot be detected and accounts for a very small fraction of the words incorrectly decoded.

Another possibility is that all recoded bits correspond to the received check bits except one. From Table 1, the Coding Table, it can be seen that the check bit must have been received incorrectly if it does not agree with the recoded bits in the decoder. If any data bit was incorrectly received, three or five recoded bits will not agree with the check bits. With one error, bits B1 through B11 are assumed to represent the data bits D1 through D11 with no error. Where the check bits C1 through C5 agree with the recoded bits R1 through R5 these bits are assumed to reflect the true parity bits P1 through P5. Where there is disagreement, the recoded bits are the true parity bits for the data bits received B1 through B11. These comparisons and corrections are made using exclusive- OR digital logic and corrected data stored in "D" type flip flops or data latches. If all five check bits disagree with the recoded bits, bit B1 must be received wrong because by complementing B1 all recoded bits will be complemented and agree with the check bits. For this situation, all check bits are assured correct and all received bits except B1. Bit B1 is complemented to obtain the true data D1.

For all other conditions where three check bits disagree with the recoded bits and two check bits agree, there is one data bit in error. Refer to Table 1, Coding Table, and determine the location of the X's where the recoded bits and check bits disagree. For example, if 1, 3 and 5 disagree, the received bit B6 is incorrect and must be complemented to obtain correct data D6. Another example may assume, the first two check bits and recoded bits agree but not the last three. Then bit B11 must be complemented to obtain the correct data D11.

Parity I is applicable when one, three, or five check bits and parity bits do not agree. If there is only one bit error in the entire 16 bit data word or sequence, the error will always be corrected by Parity I decoding. If there are three bit errors in the received 16 bit word, the word will always be incorrectly decoded by Parity I decoding. If there are two bit errors in the received 16 bit word or sequence, it cannot be decoded by Parity I decoding. It is for this reason, it is necessary to have Parity II decoding.

Parity II decoding is detected when either two or four of the check bits do not agree with the recoded received bits. There are exactly 120 combinations of 16 items taken two at a time. There is no direct method of determining which two bits of the received code word are incorrect based only on the code. However, there is a specific number of combinations containing two discrepancies between the check bits and recoded bits and this is derived by taking five items, two at a time. The answer is 10 combinations. There are also a specific number of conditions for five items taken four at a time. This number is five and with the 10 combinations listed previously, the total is 15. When the 120 total combinations of two bit errors per word, and a total of 15 combinations for discrepancies of two or four between the check bits and recoded bits, the average is eight possible different combinations of received bit errors for each combination of check bit and recoded bit discrepancy. Further, examination indicates there are exactly eight possible two bit errors for each check bit and recoded bit discrepancy combination of two or four bits. For any one combination, of two or four discrepancies between the parity check bits and recoded bits, there will be eight combinations of two bit errors. In total, these 8 combinations will include each of the received 16 bits (B1 through B11, and C1 through C5) once and only once.

Assume for example, that check bit C1 and C2 do not agree with recoded bits R1 and R2. This discrepancy could be obtained by check bits C1 and C2 being received incorrectly. However, if if B4 and C5 are received wrong, B4 will cause a discrepancy between C1 and R1, and between C2 and R2. However since C5 is received wrong it will cancel the error which would have occurred between C5 and R5. Another possible combination which will produce a discrepancy between C1 and R1, and C2 and R2 consists of an error in B1 and B11. In this example, an error in B1 will cause a discrepancy between all the check bits and recoded bits but the error in B11 will cancel the error between C3 and R3; C4 and R4; and C5 and R5. The remaining discrepancies are only C1 and R1, and C2 and R2. The eight combinations which will produce discrepancies between C1 and R1, and C2 and R2 are as follows (C1 and C2), (B2 and C3), (B4 and C5), (B6 and B9), (B1 and B11), (B3 and B4), (B5 and B8) and (B7 and B10). For convenience the entire table is provided but uses the original data and parity bits nomenclature. See table 2, Two Bit Error Set and Sub-sets.

TABLE 2

TWO BIT ERROR SET AND SUB-SETS

| | | | | |
|---|---|---|---|---|
| Sub Set 1 | (D1 - P5) (D8 - P1) | (D2 - P4) (D4 - D11) | (D3 - P3) (D6 - D10) | (D5 - P2) (D7 - D9) |
| Sub Set 2 | (D1 - P4) (D9 - P1) | (D2 - P5) (D3 - D11) | (D4 - P3) (D5 - D10) | (D6 - P2) (D7 - D8) |
| Sub Set 3 | (D1 - P3) (D10 - P1) | (D3 - P5) (D2 - D11) | (D4 - P4) (D5 - D9) | (D7 - P2) (D6 - D8) |
| Sub Set 4 | (D1 - P2) (D11 - P1) | (D5 - P5) (D2 - D10) | (D6 - P4) (D3 - D9) | (D7 - P3) (D4 - D8) |
| Sub Set 5 | (D1 - P1) (D11 - P2) | (D8 - P5) (D2 - D7) | (D9 - P4) (D3 - D6) | (D10 - P3) (D4 - D5) |
| Sub Set 6 | (D1 - D11) (D5 - D8) | (D2 - P3) (D6 - D9) | (D3 - P4) (D7 - D10) | (D4 - P5) (P1 - P2) |
| Sub Set 7 | (D1 - D10) (D5 - P4) | (D2 - P2) (D6 - P5) | (D3 - D8) (D7 - D11) | (D4 - D9) (P1 - P3) |
| Sub Set 8 | (D1 - D9) (D5 - P3) | (D2 - D8) (D6 - D11) | (D3 - P2) (D7 - P5) | (D4 - D10) (P1 - P4) |
| Sub Set 9 | (D1 - D8) (D5 - D11) | (D2 - D9) (D6 - P3) | (D3 - D10) (D7 - P4) | (D4 - P2) (P1 - P5) |
| Sub Set 10 | (D1 - D7) (D8 - P4) | (D2 - P1) (D9 - P5) | (D3 - D5) (D10 - D11) | (D4 - D6) (P2 - P3) |
| Sub Set 11 | (D1 - D6) (D8 - P3) | (D2 - D5) (D9 - D11) | (D3 - P1) (D10 - P5) | (D4 - D7) (P2 - P4) |
| Sub Set 12 | (D1 - D5) (D8 - D11) | (D2 - D6) (D9 - P3) | (D3 - D7) (D10 - P4) | (D4 - P1) (P2 - P5) |
| Sub Set 13 | (D1 - D4) (D8 - P2) | (D2 - D3) (D9 - D10) | (D5 - P1) (D11 - P5) | (D6 - D7) (P3 - P4) |
| Sub Set 14 | (D1 - D3) (D8 - D10) | (D2 - D4) (D9 - P2) | (D5 - D7) (D11 - P4) | (D6 - P1) (P3 - P5) |
| Sub Set 15 | (D1 - D2) (D8 - D9) | (D3 - D4) (D10 - P2) | (D5 - D6) (D11 - P3) | (D7 - P1) (P4 - P5) |

As another example, let it be assumed that the check bits and recoded bits 1 through 4 disagree. Using the same method of analysis, an error in B1 will cause all check bits and recoded bits to disagree but an error in C5 will cancel one error and C5 will agree with R5. Another combination of errors causing C1 through C4 to disagree with R1 through R4 respectively consists of an error in R2 which causes descrepancies between C1 through C3 with R1 through R3 respectively, and an error in C4 provides the last error of the group of errors. The eight combinations providing discrepancies between C1 through C4 with R1 through R4 respectively are (B1 and C5), (B3 and C3), (B5 and C2), (B7 and B9), (B2 and C4), (B4 and B11), (B6 and B10) and (B8 and C1). (Note in table 2, B is replaced by D and C by P to represent the correct transmitted data).

The complete table consists of eight pairs of errors in a subset and 15 subset to form 120 combinations consisting of two errors. No combination of two errors in the received bits B1 through B11 and C1 through C5 will be omitted or duplicated in a second subset.

As a consequence, if there is one, three or five discrepancies between the recoded bits and check bits, Parity I decoding will uniquely identify the single error. If there are two or four discrepancies between the recoded bits and check bits, there are two received errors and the code will uniquely identify a subset consisting of eight pairs of two errors but not the particular pair of errors. It is required to select the most probable pair of errors if there are two errors indicated from the subset consisting of eight pairs of two errors. If the code had not identified a particular subset, the choice would have to be made from 120 combinations; but the coding and checking technique has made a selection to one of 15 subsets, and the choices available have been reduced to only eight.

In Viterbi decoding, a technique is used which is called soft decision. If the one or zero selection is near the selection threshold, the soft decision weights the bit low. Conversely, if the signal is clearly a one or zero, the weighting factor is high. In Viterbi decoding, usually eight levels are defined 0 through 7. However, for this decoder, it is preferable to use a sign bit which identifies a one or zero as the data and 16 quantizing levels (0 - 15) which indicates only the magnitude and requires four bits. This process is done in commercially available soft decision bit synchronizers.

This technique does not require digital implementation but may be implemented using an analog system for the magnitude. For each of the eight combinations in the subset indicated by the code, the magnitude of the two signals are added either analog or digitally. One pair will have a value for the sum which is smaller than the other seven pair in the subset. It is this pair with the lowest sum which has the greatest probability of error and is selected as the two bits (B1 through B11 and C1 through C5) which were received incorrectly because of the noise. Since one pair has been selected, these bits are complemented to decode the data and obtain the original data D1 through D11 and parity bits P1 through P5. Although the selection is not always correct, the majority of the time the correct selection is made. Parity II decoding will provide the capability to correct errors only when two of the 16 bits of the received data word are received wrong. Combining Parity I and Parity II decoding, a very significant improvement in data error reduction is achieved since under most operating conditions, there will be only one or two errors received wrong in a 16 bit sequence or coded data word.

There is an entirely different approach which may be used. This is called Sequential decoding by rank. With each bit from the bit synchronizer is a soft decision magnitude discussed previously. The bits are then ranked by the magnitude with rank one the largest and rank 16 the smallest.

There are exactly 2048 different data values with 11 data bits ranging from 0 to 2047. If it is assumed that bit 3 has a rank one and is a zero, all words are deleted which do not have a zero for bit 3 This will eliminate one-half of the words. Bit with the rank 2 is used next and again all words with which do not have the same digital value (one or zero) which corresponds with the received bit is deleted including the parity bits. In the process, all bits received are considered as received bits and the check bit concept is not used. This process of assuming the bit with the largest rank is most probably correct and the data which does not correspond deleted can be continued for the first seven processed bits. This will reduce the number of possible words to only 16. Using the bit of rank 8, the 16 remaining words will again be divided into half leaving only eight words remaining. However, this is not also the result, in a few cases, all the words will be deleted because one of the bits received was received wrong and is not compatible with the remaining bits. To avoid this occurrence, the lower rank bit is assumed incorrect and not used leaving 16 words remaining as possible choices for the decoded output for Sequential decoding by rank at this stage of decoding. The next lower rank bit is used after verifying that all words are not deleted. It will be found that at rank 11, there will be only one remaining word 10 of 15 decoded words. Four of 15 times, only one word will remain after using the bit with rank 12, and one of 15 times bit of rank 13 is required. Bits with rank 14 through 16 are never used. This system can correctly decode some words with as many as five errors but will obtain an incorrect result if a bit with a high rank is used and was received wrong. Simulation tests show nearly similar results for both Parity I and II combined and Sequential decoding.

Improved performance is obtained when both Parity decoding and Sequential decoding are used to supplement each other. For example, if one bit of high rank is wrong and used in decoding, Sequential decoding will result in an output error but Parity I decoding will be correct. The reverse may also happen, that is, three bits of low rank will be decoded correctly by Sequential decoding and be incorrectly decoded by Parity I decoding. There is a method to choose between Parity and Sequential decoding to reduce decoded errors.

There are several possible conditions. (1) Both Sequential decoding and Parity decoding produce the same word which is correct and the correct output will be obtained. (2) Both Parity and Sequential decoding produce different results and one is correct and one is wrong. If the correct choice is made, the decoded output will be correct. (3) both Parity and Sequential decoding have incorrect outputs, and an incorrect decoded output will result.

The selection is made between Parity decoding and Sequential decoding by determining the specific bits which differ in the two decoded outputs. There will usually be four bits which do not agree and in some cases six bits. These bits are then compared with the received bits. Some of the bits will be found to be associated with the Parity I or Parity II decoded word and the remaining are associated with the Sequential decoded word. Soft decision is used by summing the magnitudes of the bits associated with Parity decoding and comparing this magnitude with those summed from Sequential decoding. The bits which have the smaller sum are assumed wrong. Consequently, the bits with the larger sum is used in the decoded output. This total combination results in better performance than either system separately.

Implementation of a practical encoder can be described without the use of a FIGURE. One method is to parallel feed a 16 bit shift register with the data to be transmitted consisting of 11 bits. The specific equations to be used for encoding are either those shown in the coding table or similar equations which can be obtained by using Boolean Algebra to add two or more equations. These data bits generate a parity but using a parity generator or similar device. This device reacts in nano seconds and provides the parity bits to the shift register nearly simultaneously with the data. The bits are shifted out using a data clock to form the serial bit stream to be transmitted.

The description of the decoder is best described using the figure provided and with reference to Table 3, Item Definition. This figure represents only one possible implementation and as newer more complex large scale integration modules are made available, the device can be simplified.

TABLE 3

| | ITEM DEFINITION |
|---|---|
| 1 | Data Input |
| 2 | Magnitude Signal |
| 3 | Clock Signal |
| 4 | Timing Signal |
| 5 | Data Input Shift Register |
| 6 | Data Storage Register |
| 7 | Timer |
| 8 | Encoder |
| 9 | Comparitor |
| 10 | Memory Unit |
| 11 | Parity I Error Detector |
| 12 | Parity I Error Corrector |
| 13 | Parity II Subset Detector |
| 14 | Magnitude Shift Register |
| 15 | Magnitude Storage Register |
| 16 | Binary Adder (1) |
| 17 | Binary Adder (60) |
| 18 | Digital to Analog Converter (D/A) |
| 19 | Digital to Analog Converter (D/A) |
| 20 | Analog Comparitor |
| 21 | Parity II Corrector |
| 22 | Parity Code Selector |
| 23 | Sequential Decoder Digital to Analog Converter (D/A) |
| 24 | Rank Comparitor |
| 25 | Rank Gate |
| 26 | Inhibit Gate |
| 27 | Parity Insertion Gate |
| 28 | Sequential Decoder Register |
| 29 | Rank Parity Generator |
| 30 | Matrix of Processed Signals |
| 31 | Orthogonal Decoder Selector |
| 32 | Orthogonal Comparitor |
| 33 | Output Storage Register |
| 34 | Decoder Output |

The unit requires Data Input 1 from a soft decision bit synchronizer. This device also provides the soft decision magnitude information represented by the Magnitude Signal 2 preferable in digital parallel form and using at least four bit precision. The soft decision bit synchronizer also provides a Clock Signal 3. A fourth signal is the Timing Signal 4 which may be a frame, subframe, prime frame or word pulse to insure the timing of the decoder is in synchronism with the data. This signal is obtained from a frame synchronizer or subframe synchronizer which are current available digital system components.

The data is fed to a 16 bit serial input, parallel output shift register which is the Data Input Shift Register 5 and may require one or two digital modules. The data is shifted in synchronism with the Clock Signal 3 obtained from the Timer 7. When a full coded data word is in the shift register, the data is transferred to a Data Storage Register 6 which may consist of parallel input parallel output shift register digital modules. This transfer takes place when the 11 bit segment and five code bits or coded data word are stored in the Data Input Shift Register 5. The start of the frame, prime frame, subframe or word is identified by the Timing Signal 4 and resets a counter to zero in the Timer 7. The counter counts to 16 or the number of bits in the coded word and provides a pulse from the Timer 7 to transfer the data from the Data Input Shift Register 5 to the Data Storage Register 6. The gating takes place in the Data Storage Register 6 using a signal from the Timer 7. If a shortened code is used, the counter counts the total number of bits in the coded word and applies the transfer function pulse. Sequential decoding by rank and Parity decoding takes place on a word by word or (segment by segment) basis allowing the use of low speed logic for most functions even though the original bit rate may be very high.

The signal from the Data Storage Register 6 is continuously available and contains both received bits B1 through B11 and the check bits C1 through C5. It should be noted that the Data Storage Register 6 is used only for storage and data latches may serve the same purpose. The bits B1 through B11 are encoded in the Encoder 8 using the same method as for transmission. The recoded bits R1 through R5 are compared with the check bits C1 through C5 using Exclusive-OR digital modules or equivalent circuits in a Comparator 9. The five outputs are fed to the input of a memory digital module in the memory Unit 10 and requires at least five inputs and eight outputs. The Memory Unit 10 is designed to provide four bit output for Parity I decoding and four bit output for Parity II decoding. The four bit are demultiplexed in a four line to 16 line decoder in the Parity I Error Detector 11. If there is an output on any of the 15 lines, it indicates recoded bits and check bits are not equal. Error detection for Parity I decoding is done in the Parity I Error Detector 11 with the exception of C5 (B16). The correction is made by the Parity I Error Corrector 12 which uses Exclusive-OR or equivalent digital modules.

The second set of four bits from the Memory Unit 10 consists of four bits which are decoded in a second four line to 16 line decoder and is called a Parity II Subset Detector 13. There will be 15 outputs which are the 15 subsets of two errors and a sixteenth output will provide error detection for bit C5 (B16) in conjunction with Parity I error detection. If there are no errors or one error, Parity I decoding will be selected in a Parity Code Selector 22. The selection is made by and-or-invert digital modules or equivalent circuitry.

It is now necessary to consider the Magnitude Signal 2 represented by four or more magnitude bits for each of the 16 received digital bits. These bits must also be shifted as the data bits and stored using the same technique as described for the Data Input Shift Register 5 and Data Storage Register 6.

For Parity II decoding, each combination of the sum of the magnitude for two bits is required. This can best be done with four bit full adders with each adder in one module. It is anticipated that at a later date the number of modules may be reduced by using large scale integration modules not yet available. Sixty of these modules will be required. Binary addition of two four words will increase the precision from four to five bits using the carry out feature. The four by 16 bit serial input shift register is the Magnitude Shift Register 14. This data must be stored by parallel input, parallel output shift register or latch circuits and is the Magnitude Storage Register 15. Typical four bit binary full adders are used to add these signals and are called binary adders. Two binary adders, Binary Adder 16 and Binary Adder 17, are shown and there will be 60 outputs from the complete complement of binary adders.

At this point it may be preferable to use analog signals for comparison. If this approach is taken 65 bit digital to analog converters are required and output gates. The digital to analog converters need to have only about 1% accuracy. Two of these digital to analog converters are shown as Digital to Analog Converter 18 and Digital to Analog Converter 19. One of the 15 signals from Parity II Subset Detector 13 will gate on the eight digital to analog converters related to one subset of Table 2 if the parity check indicates two errors in one word. An Analog Comparator 20 with eight gated input signals will determine which of the eight signals is the smallest and produce a digital output representing this signal. In combination with the gate signal from the Parity II Subset Detector 13, and the digital signal from the Analog Comparator 20, the two bits having the greatest probability of error are identified and corrected in the Parity II Corrector 21. Exclusive-OR circuits provides the actual corrections yielding Parity II decoding output. Using the Parity Code Selector 22, the output for Parity decoding is obtained.

Sequential decoding by rank operates an entirely different principle. It assumes the bit with the greatest magnitude has the greatest probability of being correct. It is therefore required that the bits be ranked one to 16 based upon the soft decision Magnitude Signal 2. Since the ranking process can readily be accomplished by analog circuits, a Sequential Decoder Digital to Analog Converter 23 converts the Magnitude Signal to an analog voltage. Since there are 16 bits per word, four bits are required to identify 16 levels. For greater resolution capability, five bit precision Magnitude Signals may be used. It is likely that occasionally two bits will fall within the same quantization level and produce outputs simultaneously. However, this should cause no significant problem because of the infrequent occurrence and the decoder will make a decision with approximately the same probability of error had they been processed sequentially.

Rank Comparator 24 determines the rank associated with each received bit. One method of implementation is to use 16 analog comparitors, one for each bit from the Sequential Decoder Digital to Analog Converter 23. These analog comparator devices are available and provide digital output. A ramp function from the Timer 7 is required for the Rank Comparitor 24 sequencing by rank.

The sequential output signal opens a Rank Gate 25 and allows the data signal from the Data Storage Register 6 to pass through. The data normally also passes through an Inhibit Gate 26 and a Parity Insertion Gate 27 to D-Type flip-flops in the Sequential Decoder Register 28. The Rank Gate 25, Inhibit Gate 26 and Parity Insertion Gate 27 contain a gate for each of the 16 bits. The Sequential Decoder register 28 stores 16 bits of data. The D-type flip-flops in the Sequential Decoder Register 28 are all set to zero at the start of Sequential decoding by a signal from the Timer 7. The D-type flip-flop associated with a particular bit is set to a digital 1 only when a 1 is received for that bit.

To fully understand the operation of Sequential Decoding it is necessary to explain rank parity. The rank parity bit relations are shown in Table 4.

TABLE 4

RANK PARITY BIT RELATIONS

| NUMBER | DATA AND PARITY BITS | | | | | | | |
|---|---|---|---|---|---|---|---|---|
| 1  | D1 | D2 | D3  | D4  | D5  | D6  | D7  | P1 |
| 2  | D1 | D2 | D3  | D4  | D8  | D9  | D10 | P2 |
| 3  | D1 | D2 | D3  | D4  | D11 | P3  | P4  | P5 |
| 4  | D1 | D2 | D5  | D6  | D8  | D9  | D11 | P3 |
| 5  | D1 | D2 | D5  | D6  | D10 | P2  | P4  | P5 |
| 6  | D1 | D2 | D7  | D8  | D9  | P1  | P4  | P5 |
| 7  | D1 | D2 | D7  | D10 | D11 | P1  | P2  | P3 |
| 8  | D1 | D3 | D5  | D7  | D8  | D10 | D11 | P4 |
| 9  | D1 | D3 | D5  | D7  | D9  | P2  | P3  | P5 |
| 10 | D1 | D3 | D6  | D8  | D10 | P1  | P3  | P5 |
| 11 | D1 | D3 | D6  | D9  | D11 | P1  | P2  | P4 |
| 12 | D1 | D4 | D5  | D8  | D11 | P1  | P2  | P5 |
| 13 | D1 | D4 | D5  | D9  | D10 | P1  | P3  | P4 |
| 14 | D1 | D4 | D6  | D7  | D8  | P2  | P3  | P4 |
| 15 | D1 | D4 | D6  | D7  | D9  | D10 | D11 | P5 |
| 16 | D2 | D3 | D5  | D8  | P1  | P2  | P3  | P4 |
| 17 | D2 | D3 | D5  | D9  | D10 | D11 | P1  | P5 |
| 18 | D2 | D3 | D6  | D7  | D8  | D11 | P2  | P5 |
| 19 | D2 | D3 | D6  | D7  | D9  | D10 | P3  | P4 |
| 20 | D2 | D4 | D5  | D7  | D8  | D10 | P3  | P5 |
| 21 | D2 | D4 | D5  | D7  | D9  | D11 | P2  | P4 |
| 22 | D2 | D4 | D6  | D8  | D10 | D11 | P2  | P4 |
| 23 | D2 | D4 | D6  | D9  | P1  | P2  | P3  | P5 |
| 24 | D3 | D4 | D5  | D6  | D8  | D9  | P4  | P5 |
| 25 | D3 | D4 | D5  | D6  | D10 | D11 | P2  | P3 |
| 26 | D3 | D4 | D7  | D8  | D9  | D11 | P1  | P3 |
| 27 | D3 | D4 | D7  | D10 | P1  | P2  | P4  | P5 |
| 28 | D5 | D6 | D7  | D8  | D9  | D10 | P1  | P2 |
| 29 | D5 | D6 | D7  | D11 | P1  | P3  | P4  | P5 |
| 30 | D8 | D9 | D10 | D11 | P2  | P3  | P4  | P3 |

These relations are obtained by adding the five original parity equations using Boolean Algebra type of addition for equations. This table is derived by taking all combinations of equations in groups from one to five.

There are several significant facts about this table. First, every bit appears exactly 15 times. Second, if seven of the bits are known, and if the parity (even or odd) is already established, the remaining bit can be deduced by a parity checker output. This means the table is expandable by a factor of 8 to obtain the effect of 240 Boolean Algebra equations. A Rank Parity Generator 29 is shown in the FIGURE. The Rank parity Generator 29 can be implemented by using 30 parity generator digital modules, one for each of the 30 groups of bits in the table. The Rank Parity Generator 29 input is obtained from each of the D-type flip-flops in the Sequential Decoder Register 28.

At the start of Sequential decoding by rank, all D-type flip-flops in the Sequential Decoder Register 28 are set to zero, and with even parity, all 30 parity outputs from the Rank Parity Generator 29 wil be zero. Assume bit 1 has rank of 1 and is a digital data 1, the parity output for the first 15 equations will be 1 because bit 1 flip-flop will be gated to the 1 state using the route from the Data Storage Register Rank Gate 25, Inhibited Gate 26, and Parity Gate 27 to the Sequential Decoder Register 28. The signal from the Sequential Decoder Register 28 is fed to Rank Parity Generator 29. The first 15 parity checkers in the Rank Parity Generator 29 will produce digital 1 outputs because of the relations shown in Table 4. If bit 2 has a rank 2 and is also a digital 1, the same route will be taken to the bit 2 flip-flop of the Sequential Decoder Register 28. A digital 1 will be sent to parity checkers 1 through 7 of table 4 causing the output of these parity checkers to return to zero. The digital 1 will also be sent to parity checkers 16 through 23 of Table 4 and generate a digital 1 state output for these devices. This process continues for each bit (which is not zero) fed to the rank parity checker within the Rank Parity Generator 29. When seven bits in any one equation are determined, the parity checker output is the digital state of the eight bit in the subset. This eight bit may be any of the bits in the subset since the order is selected by rank and not be the sequence received. This eight bit is determined from the other seven bits without the need to be received or processed.

To use the signal from the Rank Parity Generator 29, it is required to know that seven bits have been gated through by the Rank Gate 25, whether digital ones or zeros, and which bit of the subset has not been allowed to pass through the gate. This is determined by a Matrix of Processed Signals 30. The 30 sets of rank parity bit relations expands to 240 subsets since the eight bit state can be determined from the other seven. The number 240 arises from multiplying the 30 sets by eight to obtain 240.

It is established that 240 words of seven bits are significant from Table 4, the rank parity relations. It is therefore practical to determine which signals are processed by using the output of the Rank Gate 25 as the input to the Matrix of Processed Signals 30. This Matrix of Processed Signals 30 consists of eight input NAND gates, one for each subset of seven bits in each set given in the 30 equations of Table 4. When seven of the eight in one set is detected, the Matrix or Processed Signals 30 provides an inhibit signal to the Inhibit Gate 26. When a signal is inhibited, the digital data state will be obtained from the Rank Parity Generator 29. The Matrix of Processed Signals 30 signal output will inhibit use of the received bits in the Inhibit Gate 26.

To summarize, the Rank Gate 25 opens when a signal from the Rank comparitor 24 has a sufficiently high rank to be processed. No action takes place if the data is a digital zero because all bits are originally set to zero in the Sequential Decoder Register 28. However, if the bit is a digital 1, the bit will pass through to the Inhibit Gate 26. Ordinarily it will pass through the Inhibit Gate 26 unless seven of the eight bits in a subset of Table 4 have been received and processed. If seven signals have been received in one subset of eight, the output of the Matrix of Processed Signals 30 will inhibit the signal at the Inhibit Gate 26. Simultaneously, this same inhibit gate signal will enable the Rank Parity Generator 29 output signal to be inserted at the Parity Insertion Gate 27. As a consequence, the lowest rank signals of the various groups of 240 subsets are inhibited and the one or zero state for these signals are determined by the Rank Parity Generator 29. The first seven bits processed by rank are always used. Starting with the eighth bit by rank, the lower rank signals may be inhibited and the one/zero digital state is established by bits received with greater probability of being correct and set the Sequential Decoder Register 28. This completes the description of Sequential decoding by rank except the rate is chosen to be complete in less than one word period.

The rate is determined by the slope of the ramp generated in the Timer 7. This allows reloading the Data Shift Register, 5 and the Magnitude Shift Register, 14 in one word period.

The selection between Parity I and Parity II was made in the Parity Code Selector 22. If Parity and Selective decoding are both used, as in a Multiple Decoder, it is necessary to select either the Parity decoder output or the Selective decoder output. The first step is accomplished in the Orthogonal Decoder Selector 31. In the Orthogonal Decoder Selector, the bits of the Parity decoder word are compared with the bits of the Sequential decoder word. This comparison is made on a bit by bit basis using Exclusive-OR digital modules. If both are the same, the output is zero and the particular bit is not used. Usually four bits will be selected automatically for use but ocasionally there will be six. The next step, two input NAND gates are fed with the output of the Exclusive-OR circuits and the Parity decoded word on a bit by bit basis. This operation divides the four or six bits selected into two groups. One group is for gating Parity decoded word signals and the second group is used for gating Sequential Decoded word signals. If both words are identical, this condition is detected and the Parity word automatically selected. The usual output consist of one or two gate signals for Parity decoding signals and two to five signals for Sequential decoding signals.

The selected signals may be added in an analog form as is a correlation detector. The analog signals are available from the Sequential Decoder Digital to Analog Converter 23. There are two distinct outputs, one for Sequential decoding and one for Parity Decoding. There are compared in an analog comparitor. Typically a differential amplifier with a digital output. The word having the greatest magnitude of the analog sum is selected as the final decoder output.

The Orthogonal Comparitor 32 contains the circuits to compare the analog signals either the Parity decoded word or Sequential decoded word.

The decoded output is transferred to a decoder Output Storage Register 33 and provides the Decoder Output 34.

The Timer 7 is used to shift data in the shift registers and transfer data from register to register. The Sequential decoding process is timed to use about ½ word period. The system described is a hybred circuit but may be done totally digitally. When completely digital, the Sequential decoding process is sequenced each ½ bit period to shorten the time. This stepping process replaces the ramp previously described. The delay through the system is usually designed to be a few bits short of two word periods. The first word period is used to load the data into the Data Input Shift Register 5 and Magnitude Shift Register 11. The transfer to the Data Storage Register 6 and Magnitude Storage Register 15 takes place simultaneously with the input of the last bit in the word. Processing takes place during the second word period. Transfer to the Output Storage Register 33 takes place usually on the bit prior to the end of the second word period. The output is continuously available for one word period. When less than 16 bits are used in the coded word, several modifications are required. First, the timing must be shortened to the correct number of bits per word. Second, all bits which are not used are set to zero. Third, the Memory Unit 10 must be programmed for zero digital data for the bits not used. And fourth, the Rank Gate 24 must be set as though the signal has been processed for bits not used.

In order to further clarify the operation of the Memory Unit 10 in conjunction with the Parity I Error Detector 11 and Parity II Error Detector 13, table 5 is provided which is programming table. For the input side, the low order bits are on the left side. A provision must be made to detect bit C5 or bit 16 error and override both a C4 error detection and a Subset 15 error detection using suitable gates.

TABLE 5

| MEMORY UNIT PROGRAMMING | | |
|---|---|---|
| INPUT | OUTPUT | |
| 0 0 0 0 0 0 0 0 | 0 0 0 0 0 0 0 0 | No errors. |
| 0 0 0 0 0 0 0 1 | 0 0 1 1 0 0 0 0 | C1 (B12) error |
| 0 0 0 0 0 0 1 0 | 1 0 1 1 0 0 0 0 | C2 (B13) error |
| 0 0 0 0 0 0 1 1 | 0 0 0 0 0 1 1 0 | Subset 6 |
| 0 0 0 0 0 1 0 0 | 0 1 1 1 0 0 0 0 | C3 (B14) error |
| 0 0 0 0 0 1 0 1 | 0 0 0 0 1 1 1 0 | Subset 7 |
| 0 0 0 0 0 1 1 0 | 0 0 0 0 0 1 0 1 | Subset 10 |
| 0 0 0 0 0 1 1 1 | 0 1 0 0 0 0 0 0 | B2 error |
| 0 0 0 0 1 0 0 0 | 1 1 1 1 0 0 0 0 | C4 (B15) error |
| 0 0 0 0 1 0 0 1 | 0 0 0 0 0 0 1 0 | Subset 8 |
| 0 0 0 0 1 0 1 0 | 0 0 0 0 1 1 1 0 | Subset 11 |
| 0 0 0 0 1 0 1 1 | 1 1 0 0 0 0 0 0 | B3 error |
| 0 0 0 0 1 1 0 0 | 0 0 0 0 1 0 1 1 | Subset 13 |
| 0 0 0 0 1 1 0 1 | 1 0 1 0 0 0 0 0 | B5 error |
| 0 0 0 0 1 1 1 0 | 0 0 1 0 0 0 0 0 | B8 error |
| 0 0 0 0 1 1 1 1 | 0 0 0 0 1 0 0 0 | Subset 1 |
| 0 0 0 1 0 0 0 0 | 1 1 1 1 1 1 1 1 | C5 (B16) error |
| 0 0 0 1 0 0 0 1 | 0 0 0 0 1 0 1 0 | Subset 9 |
| 0 0 0 1 0 0 1 0 | 0 0 0 0 0 0 1 1 | Subset 12 |
| 0 0 0 1 0 0 1 1 | 0 0 1 0 0 0 0 0 | B4 error |
| 0 0 0 1 0 1 0 0 | 0 0 0 0 0 1 1 1 | Subset 14 |
| 0 0 0 1 0 1 0 1 | 0 1 1 0 0 0 0 0 | B6 error |
| 0 0 0 1 0 1 1 0 | 0 1 0 1 0 0 0 0 | B9 error |
| 0 0 0 1 0 1 1 1 | 0 0 0 0 0 1 0 0 | Subset 2 |
| 0 0 0 1 1 0 0 0 | 0 0 0 0 1 1 1 1 | Subset 15 |
| 0 0 0 1 1 0 0 1 | 1 1 1 0 0 0 0 0 | B7 error |
| 0 0 0 1 1 0 1 0 | 0 0 0 0 0 1 1 0 | B10 error |
| 0 0 0 1 1 0 1 1 | 0 0 0 0 1 1 0 0 | Subset 3 |
| 0 0 0 1 1 1 0 0 | 1 1 0 1 0 0 0 0 | B11 error |
| 0 0 0 1 1 1 0 1 | 0 0 0 0 0 0 1 0 | Subset 4 |
| 0 0 0 1 1 1 1 0 | 0 0 0 0 1 0 1 0 | Subset 5 |
| 0 0 0 1 1 1 1 1 | 1 0 0 0 0 0 0 0 | B1 error |

I claim:

1. A Parity decoder for decoding coded digital data consisting of the data and parity check bits, the decoder comprising, a serial data input shift register means for accepting the coded data, a timer means for synchronizing the operation of said decoder by using a clock input and timing signal input, a magnitude shift register means for accepting magnitude data related to the coded digital data, said timer is connected to said data input shift register and said magnitude shift register, said clock signal via said timer causes the transfer to data in said data input shift register from the input end toward the output end of said data input shift register, similarly said clock signal causes the transfer of the magnitude signal data from the input of said magnitude shift register toward the output of said magnitude shift register, said data input shift register is connected to a data storage register means which stores the digital data, said magnitude shift register is connected to a magnitude storage register means which stores the magnitude data, a signal from said timer which is connected to said data storage register and said magnitude storage register transfers the data from said data input shift register to the data storage register and transfers the magnitude data from said magnitude shift register to said magnitude storage register, said data storage register is connected to an encoder means which encodes the uncoded portion of the data stored in said data storage register, said encoder is connected to a comparitor means and said comparitor is also connected to said data storage register, said comparitor compares the check bits from said encoder with check bits from the data storage register and generates error signals, said comparitor is connected to a memory unit means, said memory unit is connected to a Parity II subset detector means and to a Parity I error detector means, said memory unit recognizes the error signal pattern and provides control signals to said Parity I error detector and said Parity II subset detector, said Parity I error detector is connected to Parity I error corrector means, said data storage register is also connected to said Parity I error corrector, said Parity I error corrector corrects one bit error in the digital data from said data storage register using a corrector signal from said Parity I error detector, said Parity I error corrector is connected to a Parity code selector means, said magnitude storage register is connected to a plurality of added means, said adders add the magnitude data for pairs of bits, said adders are connected to a plurality of digital data to a set of analog voltages, said Sequential decoder analog to digital converter is connected to a rank comparitor means which orders the signals based upon absolute magnitude, said timer is connected to said rank comparitor, said timer signal allows passage of the signals in sequence starting with the signal with greatest magnitude, said rank comparitor is connected to a rank gate means, said data storage register is connected to said rank gate, said rank comparitor output signals allows passage of the data from said data storage register through said rank gate, said rank gate is connected to an inhibit gate means, said inhibit gate inhibits passage of data bits when sufficient data bits have been processed to determine the data bits inhibited using data previously processed, said inhibit gate is connected to a parity insertion gate means, said parity insertion is connected to a Sequential decoder register means, said Sequential decoder register stores data from said parity insertion gate, said Sequential decoder register is connected to a rank parity generator means, said rank parity generator encodes data stored in said Sequential decoder register, said rank parity generator is connected to said parity insertion gate, said rank comparitor is connected to a matrix of processed signal means, said matrix of processed signals determines when a sufficient number of data bits have been processed to determine other data bits which have not been processed, said matrix of processed signals is connected to said inhibit gate and said parity insertion gate, control signals from said matrix of processed signals inhibit processing of signals in said inhibit gate and insert data generated by said rank parity generator in said parity insertion gate, the output signal from said Sequential decoder register is the Sequential decoder output, said timer is connected to said Sequential decoder register, said timer signal resets said Sequential decoder register to zero after processing each word.

2. A Multiple decoder for decoding coded digital data consisting of the data and parity check bits, the decoder comprising, a serial data input shift register means for accepting the coded data, a timer means for synchronizing the operation of said decoder by using a clock input and timing signal input, a magnitude shift register means for accepting magnitude data related to the coded digital data, said timer is connected to said data input shift register and said magnitude shift register, said clock signal to analog converter means which convert said digital magnitude data to analog magnitude data, said plurality of digital to analog converters are connected to an analog comparator means, said Parity II subset detector is also connected to said analog comparator, the signal from said Parity II subset detector selects signals from said digital to analog converters for comparison in said analog comparator, said analog comparitor is connected to a Parity II corrector means, said data storage register is also connected to said Parity II corrector, the signal from said analog comparator corrects two received bit errors in said Parity II corrector, said Parity II corrector is connected to Parity code selector means, said Parity II subset detector is also connected to said Parity code selector and this signal causes the selection of the signal from said Parity I error corrector or the signal from said Parity II corrector, the output from said Parity code selector is the Parity decoder output.

3. A Sequential decoder for decoding coded digital data consisting of the data and parity check bits, the decoder comprising, a serial data input shift register means for accepting the coded data, a timer means for synchronizing the operation of said decoder by using a clock input and timing signal input, a magnitude shift register means for accepting magnitude data related to the coded digital data, said timer is connected to said data input shift register and said magnitude shift register, said clock signal via said timer synchronizes the operation of said decoder and causes the transfer of data in said data input shift register from the input end toward the output end of said data input shift register, similarly said clock signal causes the transfer of the magnitude signal from the input of said magnitude shift register toward the output of said magnitude shift register, said data input shift register is connected to a data storage register means which stores the digital data, said magnitude shift register is connected to a magnitude storage register means which stores the magnitude data, a signal from said timer which is connected to said data storage register and to said magnitude store register transfers the data from said data input shift register to said data storage register and transfers the magnitude data from said magnitude shift register to the magnitude storage register, said magnitude storage register is connected to a Sequential decoder digital to analog converter means to convert digital via said timer causes the transfer of data in said data input shift register from the input end toward the output end of the data input shift register, similarly said clock signal causes the transfer of the magnitude signal data from the input of said magnitude shift register toward the output of said magnitude shift register, said data input shift register is connected to a data storage register means which stores the digital data, said magnitude shift register is connected to a magnitude storage register means which stores the magnitude data, a signal from said timer which is connected to said data storage register and said magnitude storage register transfers the data from said data input shift register to said data storage register and transfers the magnitude data from said magnitude shift register to said magnitude storage register, said data storage register is connected to an encoder means which encodes the uncoded portion of the data stored in said data storage register, said encoder is connected to a comparitor means and said comparitor is also connected to said data storage register, said comparitor compares the check bits from said encoder with check bits from the data storage register and generates error signals, said comparitor is connected to a memory unit means, said memory unit is connected to a Parity II subset detector means and to a Parity I error detector means, said memory unit recognizes the error signal pattern and provides control signals to said Parity I error detector and said Parity II subset detector, said Parity I error detector is connected to Parity I error corrector means, said data storage register is also connected to said Parity I error corrector, said Parity I error corrector corrects one bit error in the digital data from said data storage register using a corrector signal from said Parity I error detector, said Parity I error corrector is connected to a Parity code selector means, said magnitude storage register is connected to a plurality of adder means, said adders add the magnitude data for pairs of bits, and adders are connected to a plurality of digital to analog converter means which convert said digital magnitude data to analog magnitude data, said plurality of digital to analog converters are connected to an analog comparitor means, said Parity II subset detector is also connected to said analog comparator, the signal from said Parity II subset detector selects signals from said digital to analog converters for comparison in said analog comparitor, said analog comparator is connected to a Parity II corrector means, said data storage register is also connected to said Parity II corrector, the signal from said analog comparitor corrects two received bit errors in said Parity II corrector, said Parity II corrector is connected to Parity code selector means, said Parity II subset detector is also connected to said Parity code selector and this signal causes the selection of the signal from said Parity I error corrector or the signal from said Parity II corrector, the output from said Parity code selector is the Parity decoder output, said magnitude storage register is connected to a Sequential decoder digital to analog converter means to convert digital data to a set of analog voltages, said Sequential decoder analog to digital converter is connected to a rank comparitor means which orders the signals based upon absolute magnitude, said timer is connected to said rank comparitor, said timer signal allows passage of the signals in sequence starting with the signal with greatest magnitude, said rank comparitor is connected to a rank gate means, said data storage register is connected to said rank gate, said rank comparitor output signals allows passage of the data from said data storage register through said rank gate, said rank gate is connected to an inhibit gate means, said inhibit gate inhibits passage of data bits when sufficient data bits have been processed to determine the data bits inhibited using data previously processed, said inhibit gate is connected to a parity insertion gate means, said parity insertion gate is connected to a Sequential decoder register means, said Sequential decoder register stores data from said parity insertion gate, said Sequential decoder register is connected to a rank parity generator means, said rank parity generator encodes data stored in said Sequential decoder register, said rank parity generator is connected to said parity insertion gate, said rank comparitor is connected to a matrix of processed signal means, said matrix of processed signals means determines when a sufficient number of data bits have been processed to determine other data bits which have not been processed, said matrix of processed signals is connected to said inhibit gate and said parity insertion gate, control signals from said matrix of processed signals inhibit processing of signals in said inhibit gate and insert data generated by said rank parity generator in said parity insertion gate, the output signal from said Sequential decoder register is the Sequential decoder output, said timer is connected to said Sequential decoder register, said timer signal resets said Sequential decoder register to zero after processing each word, said Parity code selector is connected to an orthogonal decoder selector means, said Sequential decoder register is also connected to said orthogonal decoder selector, said orthogonal decoder determines which bits do not agree in the two decoded words, said orthogonal decoder selector is connected to an orthogonal comparitor means, said orthogonal comparitor is connected to said Sequential decoder digital to analog converter, said orthogonal comparitor selects either the Parity decoded word or the Sequential decoded word based upon the magnitude of the signal from said orthogonal comparitor, said orthogonal comparitor is connected to the output storage register means, the signal from said orthogonal comparitor is stored in said output storage register, the output from said output storage register is the Multiple decoder output.

* * * * *

UNITED STATES PATENT OFFICE
CERTIFICATE OF CORRECTION

Patent No. 4,038,636          Dated July 26, 1977

Inventor(s) George D. Doland

It is certified that error appears in the above-identified patent and that said Letters Patent are hereby corrected as shown below:

Columns 15 thru 18 should be deleted and substituted with the attached Columns, respectively.

Signed and Sealed this

Seventh Day of February 1978

[SEAL]

Attest:

RUTH C. MASON
*Attesting Officer*

LUTRELLE F. PARKER
*Acting Commissioner of Patents and Trademarks* register is also connected to said Parity I error corrector, said Parity I error corrector corrects one bit error in the digital data from said data storage register using a corrector signal from said Parity I error detector, said Parity I error corrector is connected to a Parity code selector means, said magnitude storage register is connected to a plurality of added means, said adders add the magnitude data for pairs of bits, said adders are connected to a plurality of digital to analog converter means which convert said digital magnitude data to analog magnitude data, said plurality of digital to analog converters are connected to an analog comparator means, said Parity II subset detector is also connected to said analog comparitor, the signal from said Parity II subset detector selects signals from said digital to analog converters for comparison in said analog comparitor, said analog comparitor is connected to a Parity II corrector means, said data storage register is also connected to said Parity II corrector, the signal from said analog comparitor corrects two received bit errors in said Parity II corrector, said Parity II corrector is connected to Parity code selector means, said Parity II subset detector is also connected to said Parity code selector and this signal causes the selection of the signal from said Parity I error corrector or the signal from said Parity II corrector, the output from said Parity code selector is the Parity decoder output.

2. A Multiple decoder for decoding coded digital data consisting of the data and parity check bits, the decoder comprising, a serial data input shift register means for accepting the coded data, a timer means for synchronizing the operation of said decoder by using a clock input and timing signal input, a magnitude shift register means for accepting magnitude data related to the coded digital data, said timer is connected to said data input shift register and said magnitude shift register, said clock signal via said timer causes the transfer of data in said data input shift register from the input end toward the output end of the data input shift register, similarly said clock signal causes the transfer of the magnitude signal data from the input of said magnitude shift register toward the output of said magnitude shift register, said data input shift register is connected to a data storage register means which stores the digital data, said magnitude shift register is connected to a magnitude storage register means which stores the magnitude data, a signal from said timer which is connected to said data storage register and said magnitude storage register transfers the data from said data input shift register to said data storage register and transfers the magnitude data from said magnitude shift register to said magnitude storage register, said data storage register is connected to an encoder means which encodes the uncoded portion of the data stored in said data storage register, said encoder is connected to a comparitor means and said comparitor is also connected to said data storage register, said comparitor compares the check bits from said encoder with check bits from the data storage register and generates error signals, said comparitor is connected to a memory unit means, said memory unit is connected to a Parity II subset detector means and to a Parity I error detector means, said memory unit recognizes the error signal pattern and provides control signals to said Parity I error detector and said Parity II subset detector, said Parity I error detector is connected to Parity I error corrector means, said data storage register is also connected to said Parity I error corrector, said Parity I error corrector corrects one bit error in the digital data from said data storage register using a corrector signal from said Parity I error detector, said Parity I error corrector is connected to a Parity code selector means, said magnitude storage register is connected to a plurality of adder means, said adders add the magnitude data for pairs of bits, and adders are connected to a plurality of digital to analog converter means which convert said digital magnitude data to analog magnitude data, said plurality of digital to analog converters are connected to an analog comparitor means, said Parity II subset detector is also connected to said analog comparitor, the signal from said Parity II subset detector selects signals from said digital to analog converters for comparison in said analog comparitor, said analog comparitor is connected to a Parity II corrector means, said data storage register is also connected to said Parity II corrector, the signal from said analog comparitor corrects two received bit errors in said Parity II corrector, said Parity II corrector is connected to Parity code selector means, said Parity II subset detector is also connected to said Parity code selector and this signal causes the selection of the signal from said Parity I error corrector or the signal from said Parity II corrector, the output from said Parity code selector is the Parity decoder output, said magnitude storage register is connected to a Sequential decoder digital to analog converter means to convert digital data to a set of analog voltages, said Sequential decoder analog to digital converter is connected to a rank comparitor means which orders the signals based upon absolute magnitude, said timer is connected to said rank comparitor, said timer signal allows passage of the signals in sequence starting with the signal with greatest magnitude, said rank comparitor is connected to a rank gate means, said data storage register is connected to said rank gate, said rank comparitor output signals allows passage of the data from said data storage register through said rank gate, said rank gate is connected to an inhibit gate means, said inhibit gate inhibits passage of data bits when sufficient data bits have been processed to determine the data bits inhibited using data previously processed, said inhibit gate is connected to a parity insertion gate means, said parity insertion gate is connected to a Sequential decoder register means, said Sequential decoder register stores data from said parity insertion gate, said Sequential decoder register is connected to a rank parity generator means, said rank parity generator encodes data stored in said Sequential decoder register, said rank parity generator is connected to said parity insertion gate, said rank comparitor is connected to a matrix of processed signal means, said matrix of processed signals means determines when a sufficient number of data bits have been processed to determine other data bits which have not been processed, said matrix of processed signals is connected to said inhibit gate and said parity insertion gate, control signals from said matrix of processed signals inhibit processing of signals in said inhibit gate and insert data generated by said rank parity generator in said parity insertion gate, the output signal from said Sequential decoder register is the Sequential decoder output, said timer is connected to said Sequential decoder register, said timer signal resets said Sequential decoder register to zero after processing each word, said Parity code selector is connected to an orthogonal decoder selector means, said Sequential decoder register is also connected to said orthogonal decoder selector, said orthogonal decoder determines which bits do not agree in the two decoded words, said orthogonal decoder selector is connected to an orthogonal comparitor means, said orthogonal comparitor is connected to said Sequential decoder digital to analog converter, said orthogonal comparitor selects either the Parity decoded word or the Sequential decoded word based upon the magnitude of the signal from said orthogonal comparitor, said orthogonal comparitor is connected to the output storage register means, the signal from said orthogonal comparitor is stored in said output storage register, the output from said output storage register is the Multiple decoder output.

3. A Sequential decoder for decoding coded digital data consisting of the data and parity check bits, the decoder comprising, a serial data input shift register means for accepting the coded data, a timer means for synchronizing the operation of said decoder by using a clock input and timing signal input, a magnitude shift register means for accepting magnitude data related to the coded digital data, said timer is connected to said data input shift register and said magnitude shift register, said clock signal via said timer synchronizes the operation of said decoder and causes the transfer of data in said data input shift register from the input end toward the output end of said data input shift register, similarly said clock signal causes the transfer of the magnitude signal from the input of said magnitude shift register toward the output of said magnitude shift register, said data input shift register is connected to a data storage register means which stores the digital data, said magnitude shift register is connected to a magnitude storage register means which stores the magnitude data, a signal from said timer which is connected to said data storage register and to said magnitude store register transfers the data from said data input shift register to said data storage register and transfers the magnitude data from said magnitude shift register to the magnitude storage register, said magnitude storage register is connected to a Sequential decoder digital to analog converter means to convert digital data to a set of analog voltages, said Sequential decoder analog to digital converter is connected to a rank comparitor means which orders the signals based upon absolute magnitude, said timer is connected to said rank comparitor, said timer signal allows passage of the signals in sequence starting with the signal with greatest magnitude, said rank comparitor is connected to a rank gate means, said data storage register is connected to said rank gate, said rank comparitor output signals allows passage of the data from said data storage register through said rank gate, said rank gate is connected to an inhibit gate means, said inhibit gate inhibits passage of data bits when sufficient data bits have been processed to determine the data bits inhibited using data previously processed, said inhibit gate is connected to a parity insertion gate means, said parity insertion is connected to a Sequential decoder register means, said Sequential decoder register stores data from said parity insertion gate, said Sequential decoder register is connected to a rank parity generator means, said rank parity generator encodes data stored in said Sequential decoder register, said rank parity generator is connected to said parity insertion gate, said rank comparitor is connected to a matrix of processed signal means, said matrix of processed signals determines when a sufficient number of data bits have been processed to determine other data bits which have not been processed, said matrix of processed signals is connected to said inhibit gate and said parity insertion gate, control signals from said matrix of processed signals inhibit processing of signals in said inhibit gate and insert data generated by said rank parity generator in said parity insertion gate, the output signal from said Sequential decoder register is the Sequential decoder output, said timer is connected to said Sequential decoder register, said timer signal resets said Sequential decoder register to zero after processing each word.

* * * * *